(12) United States Patent
Sakai et al.

(10) Patent No.: US 9,726,692 B2
(45) Date of Patent: Aug. 8, 2017

(54) CONTACTOR AND PROBE USING SAME

(75) Inventors: Takahiro Sakai, Moriyama (JP);
Yoshinobu Hemmi, Otsu (JP)

(73) Assignee: OMRON CORPORATION, Kyoto-Shi (JP)

(*) Notice: Subject to any disclaimer, the term of this patent is extended or adjusted under 35 U.S.C. 154(b) by 266 days.

(21) Appl. No.: 14/342,534

(22) PCT Filed: Mar. 15, 2012

(86) PCT No.: PCT/JP2012/056658
§ 371 (c)(1),
(2), (4) Date: Mar. 3, 2014

(87) PCT Pub. No.: WO2013/054558
PCT Pub. Date: Apr. 18, 2013

(65) Prior Publication Data
US 2014/0225638 A1    Aug. 14, 2014

(30) Foreign Application Priority Data
Oct. 14, 2011  (JP) .................................. 2011-227271

(51) Int. Cl.
*G01R 1/067* (2006.01)
*H01R 13/24* (2006.01)

(52) U.S. Cl.
CPC ......... *G01R 1/067* (2013.01); *G01R 1/06722* (2013.01); *H01R 13/2428* (2013.01); *H01R 2201/20* (2013.01)

(58) Field of Classification Search
CPC  G01R 1/067; G01R 1/06722; H01R 13/2428; H01R 2201/20

USPC ............. 324/755.04, 755.01, 755.05, 755.06
See application file for complete search history.

(56) References Cited

U.S. PATENT DOCUMENTS

| | | | | |
|---|---|---|---|---|
| 4,773,877 A | * | 9/1988 | Kruger ............... | G01R 1/06722 324/755.05 |
| 5,865,641 A | * | 2/1999 | Swart ................... | H01R 12/714 439/482 |
| 6,290,524 B1 | * | 9/2001 | Simmel .............. | H01R 13/6464 439/289 |

(Continued)

FOREIGN PATENT DOCUMENTS

| | | |
|---|---|---|
| JP | S5537787 A | 3/1980 |
| JP | 10125428 | 5/1998 |

(Continued)

OTHER PUBLICATIONS

International Search Report for corresponding application PCT/JP2012/056658 filed Mar. 15, 2012; Mail date Jun. 5, 2012.

(Continued)

*Primary Examiner* — Patrick Assouad
*Assistant Examiner* — Khristopher Yodichkas
(74) *Attorney, Agent, or Firm* — Shinjyu Global IP

(57) ABSTRACT

A contactor including a bellows body, a fixed portion connected to one end of the bellows body, and a movable portion connected to the other end of the bellows body, where the bellows body, the fixed portion and the movable portion are integrally molded by electroforming, and the movable portion is configured to be depressed to compress the bellows body, so that adjacent arc portions of the bellows body are brought into contact with each other to cause a short circuit.

16 Claims, 14 Drawing Sheets

(56) References Cited

U.S. PATENT DOCUMENTS

| | | | |
|---|---|---|---|
| 6,402,567 B1 * | 6/2002 | Zhu | H01R 13/2428 439/66 |
| 7,150,658 B1 | 12/2006 | Chien | |
| 2005/0184748 A1 * | 8/2005 | Chen | G01R 1/0675 324/755.05 |
| 2009/0111289 A1 | 4/2009 | Vinther | |
| 2010/0136821 A1 * | 6/2010 | Huang | H01R 13/193 439/422 |
| 2011/0057675 A1 | 3/2011 | Kim et al. | |

FOREIGN PATENT DOCUMENTS

| | | |
|---|---|---|
| JP | 2002008760 | 1/2002 |
| JP | 2002134202 A | 5/2002 |
| JP | 2002164135 | 6/2002 |
| JP | 2003307525 A | 10/2003 |
| JP | 2004138391 | 5/2004 |
| JP | 3120893 U | 4/2006 |
| JP | 3122168 U | 6/2006 |
| JP | 2008047417 | 2/2008 |
| JP | 2009128218 | 6/2009 |
| JP | 2009146817 | 7/2009 |
| JP | 2011502339 | 1/2011 |
| JP | 2011146295 | 7/2011 |

OTHER PUBLICATIONS

International Search Report for corresponding application PCT/JP2012/056654 filed Mar. 15, 2012; Mail date Jun. 5, 2012.
International Search Report for corresponding application PCT/JP2012/056655 filed Mar. 15, 2012; Mail date Jun. 5, 2012.
International Search Report for corresponding application PCT/JP2012/056657 filed Mar. 15, 2012; Mail date Jun. 5, 2012.
A European Serach Report from the corresponding European Patent Application No. 12840524.8 issued on Mar. 27, 2015.

\* cited by examiner

CONTACTOR AND PROBE USING SAME

CROSS REFERENCE TO RELATED APPLICATION

This application is the United States National Phase of International Patent Application Number PCT/JP2012/056658 filed on 15 Mar. 2012 which claims priority to Japanese Patent Application No. 2011-227271 filed on 14 Oct. 2011, all of which said applications are herein incorporated by reference in their entirety.

TECHNICAL FIELD

The present invention relates to a contactor, and for example, relates to a contactor used for an integrated circuit inspection probe.

BACKGROUND ART

In the past, a contactor used for an integrated circuit inspection probe, has traditionally been a contactor of an electronic terminal receptacle, which holds contact between an electrode terminal of an electronic component and an electrode portion of a receptacle body by depressing the electronic component to the receptacle body, and which connects the electrode portion of the receptacle body to an electrode terminal of a connected electronic component. The electrode portion of the receptacle main body is formed by performing punching on an elastic plate material with a predetermined thickness, and has at both ends a pair of contacts respectively connected with the electrode terminal of the electronic component and the electrode terminal of the connected electronic component, while having a meandering portion successively installed in parallel and provided between the pair of contacts to connect the pair of contacts. Such configuration can be seen, for example, in Japanese Unexamined Patent Publication No. 2002-134202.

However, the above contactor of the electronic terminal receptacle is one obtained by punching and molding by press working. For this reason, when the contactor has a narrow and long shape, processing strain increases to make torsion apt to occur throughout the contactor, the contactor has a short life, and a mold has high production cost, all of which are problematic.

BRIEF SUMMARY

The invention provides a contactor and a probe using the same, the contactor being free of occurrence of processing strain and having a long life and low production cost even when it is a narrow and long contactor.

A contactor is provided including a bellows body, a fixed portion connected to one end of the bellows body, and a movable portion connected to the other end of the bellows body, where the bellows body, the fixed portion and the movable portion are integrally molded by electroforming, and the movable portion is configured to be depressed to compress the bellows body, so that adjacent arc portions of the bellows body are brought into contact with each other to cause a short circuit.

DETAILED DESCRIPTION

Figure 1:
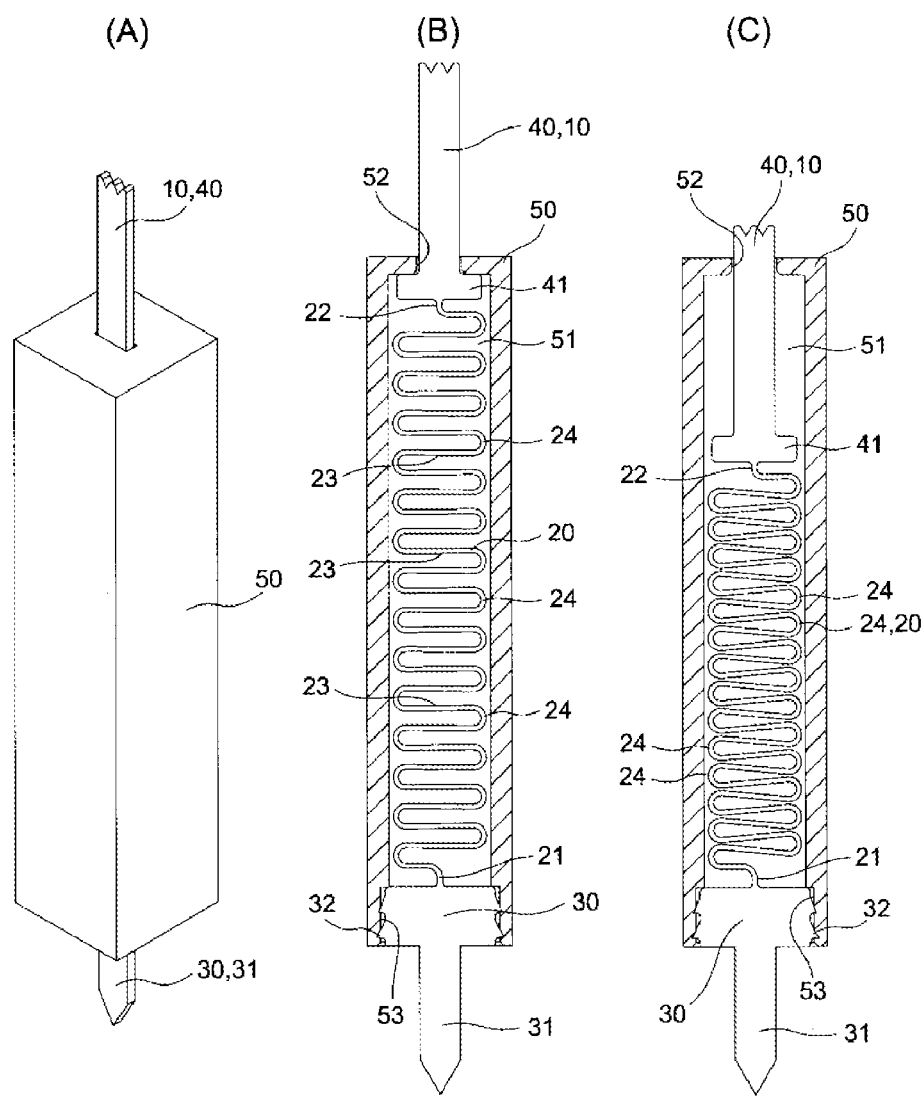
FIG. 1A is a perspective view showing a first embodiment of a contactor according to the present invention.
FIGS. 1B and 1C are front sectional views respectively showing the contactor before and after an operation.
Figure 2:
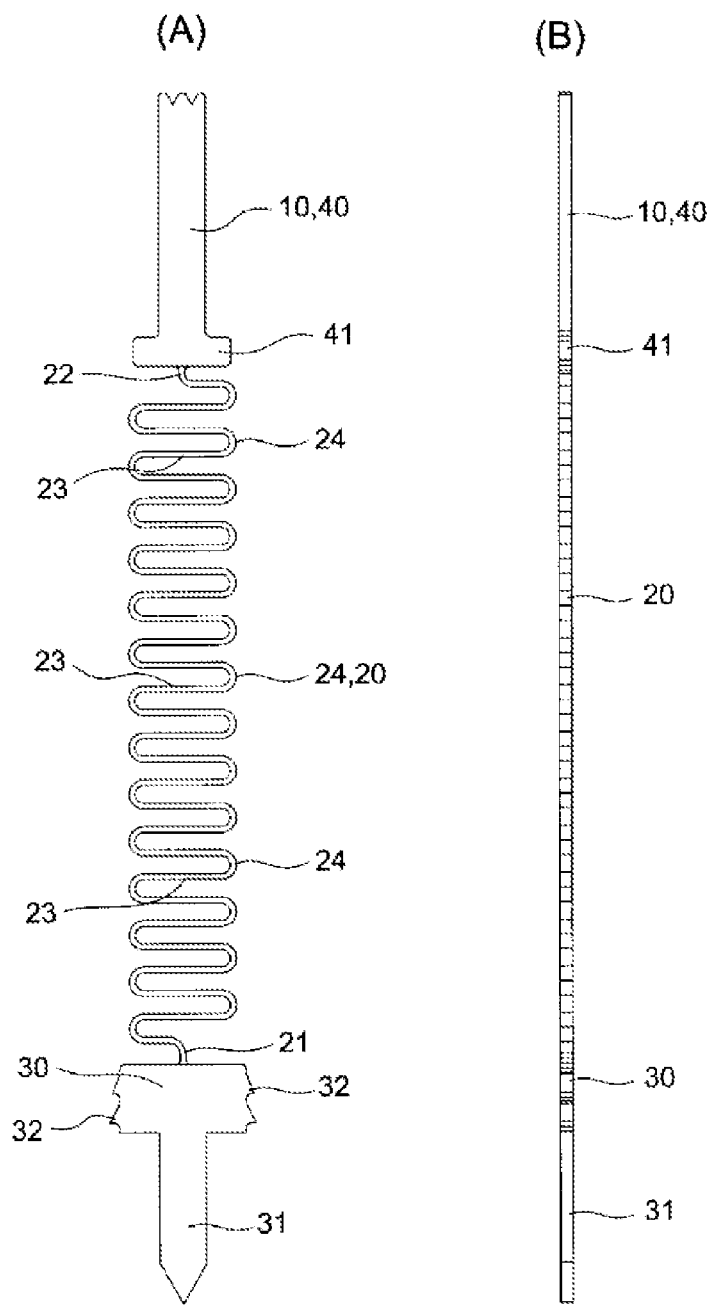
FIGS. 2A and 2B are a front view and a right side view of the contactor shown in FIG. 1, respectively.

Embodiments of a contactor according to the present invention will be described in accordance with the accompanying drawing of FIGS. 1 to 14.

A first embodiment is one in which, as shown in FIGS. 1 to 4, a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23, and arc portions 24 each connecting adjacent intermediate portions 23. The bellows body 20 is produced by electrical casting, and has a cross section with an aspect ratio being not smaller than 1.5, preferably 2 to 4.

This is because, when the aspect ratio is less than 1.5, torsion is apt to occur, and when the aspect ratio exceeds 4, it becomes difficult to reduce the thickness. It is to be noted that the aspect ratio here refers to a ratio between a thickness and a height of the cross section of the bellows body 20.

The one end 21 of the bellows body 20 is connected at a shaft center of the fixed portion 30 at the upper end thereof, and a terminal portion 31 is extended at the shaft center at the lower end of the fixed portion 30. Further, a locking claw portion 32 is projectingly provided on each side surface of the fixed portion 30.

The movable portion 40 has a substantially T-shape on the front surface, and the other end 22 of the bellows body 20 is connected at the shaft center at the lower end of a large width portion 41 of the movable portion 40.

Figure 3:
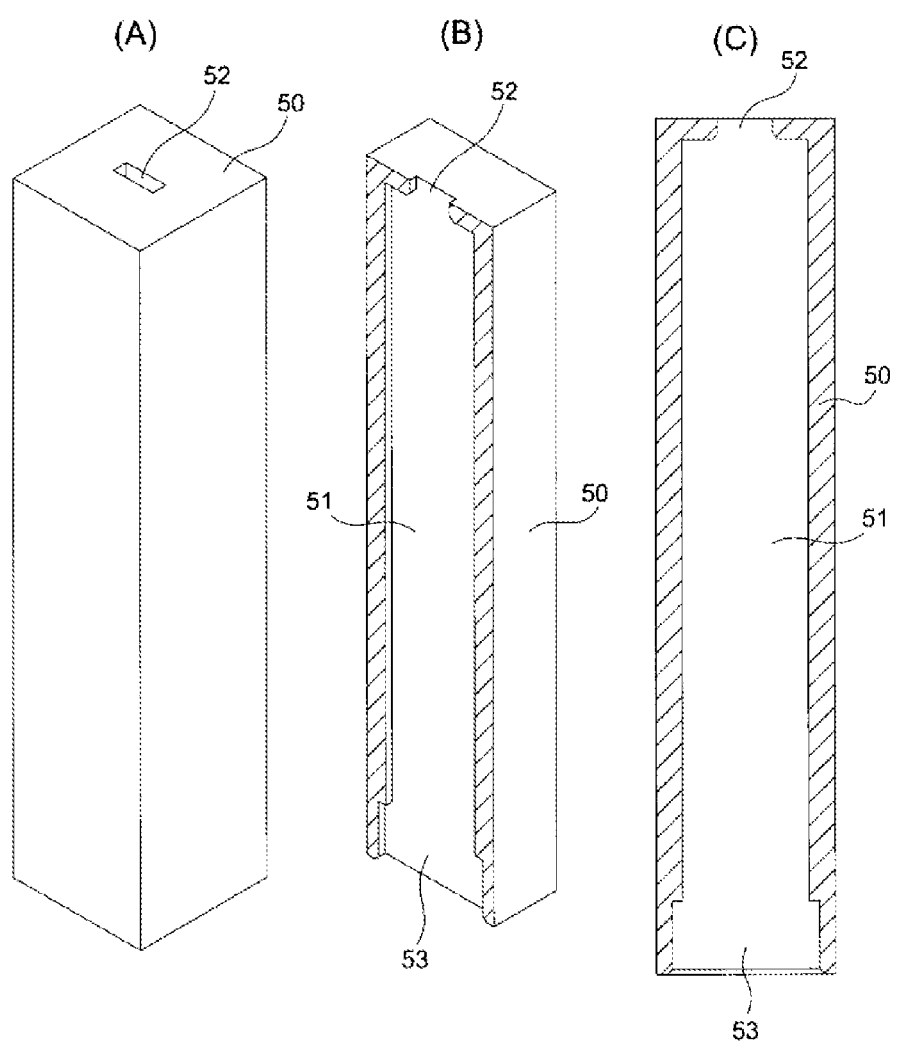
FIGS. 3A, 3B and 3C are a perspective view, a perspective sectional view and a front sectional view of the housing shown in FIG. 1, respectively.
Figure 4:
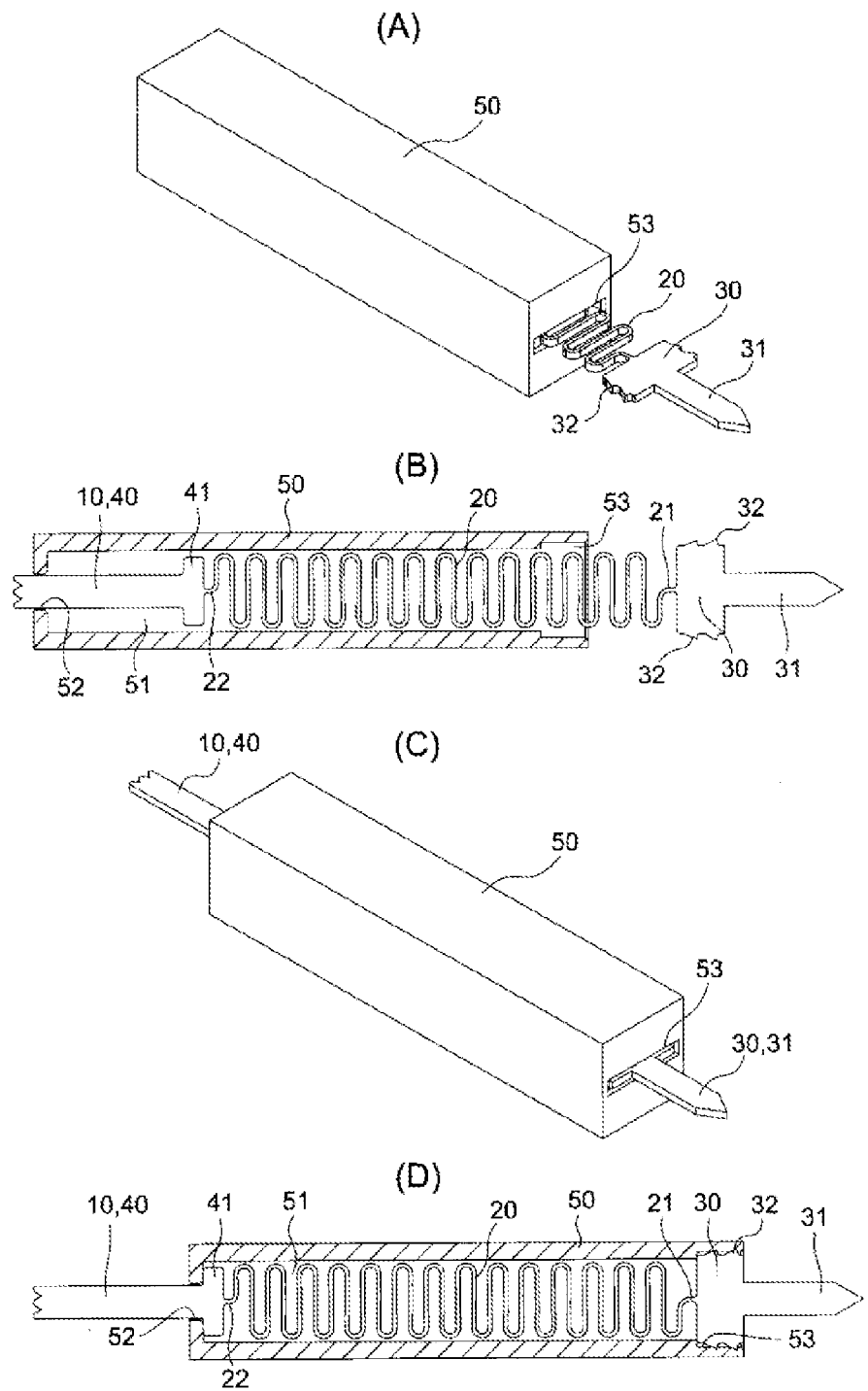
FIGS. 4A and 4B are a perspective view and a sectional view showing an assembly process of the contactor shown in FIG. 1, respectively.
FIGS. 4C and 4D are a perspective view and a sectional view showing the contactor after completion of the assembly, respectively.

As shown in FIG. 3, the housing 50 has a rectangular-parallelepiped shape having a slit 51 capable of housing the contactor 10, and the upper end of the housing 50 has an operation hole 52, while the lower end thereof has a press-fitting hole 53.

In the case of assembling the contactor 10 in the housing 50, as shown in FIGS. 4A and 4B, the movable portion 40 of the contactor 10 is inserted from the press-fitting hole 53 of the housing 50 and the locking claw portion 32 of the fixed portion 30 is locked onto the inner surface of the press-fitting hole 53, to prevent slipping-out.

Then, as shown in FIG. 1, when the movable portion 40 is pressed down, the large width portion 41 descends, the bellows body 20 are compressed, and the adjacent arc portions 24 comes into contact with each other to cause a short circuit. Hence the contact resistance decreases according to a displacement amount of the movable portion 40 and a current flows.

Figure 5:
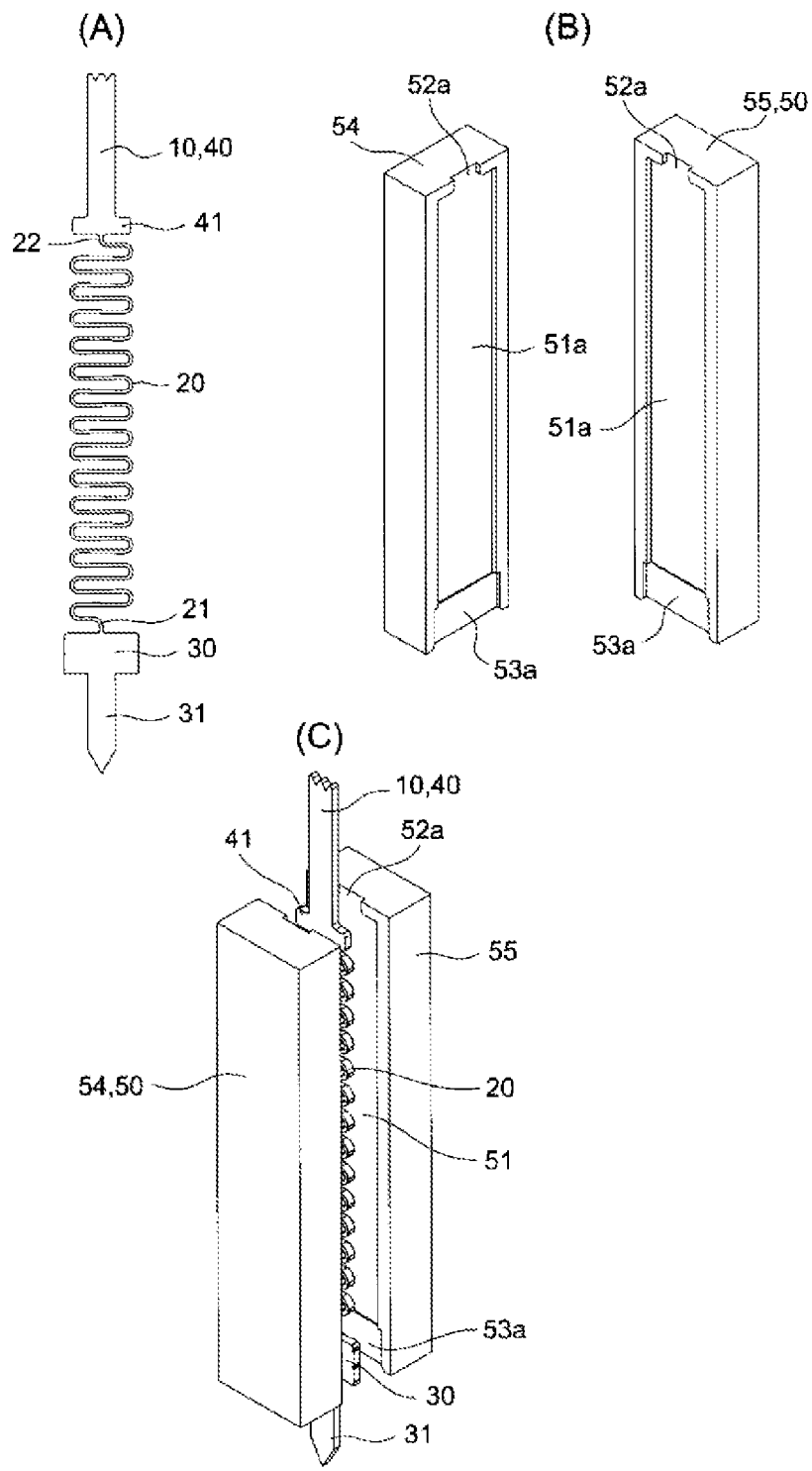
FIGS. 5A and 5B are a perspective view of a contactor and an exploded perspective view of a housing according to a second embodiment, respectively.
FIG. 5C is an exploded perspective view for explaining an assembly method.
Figure 6:
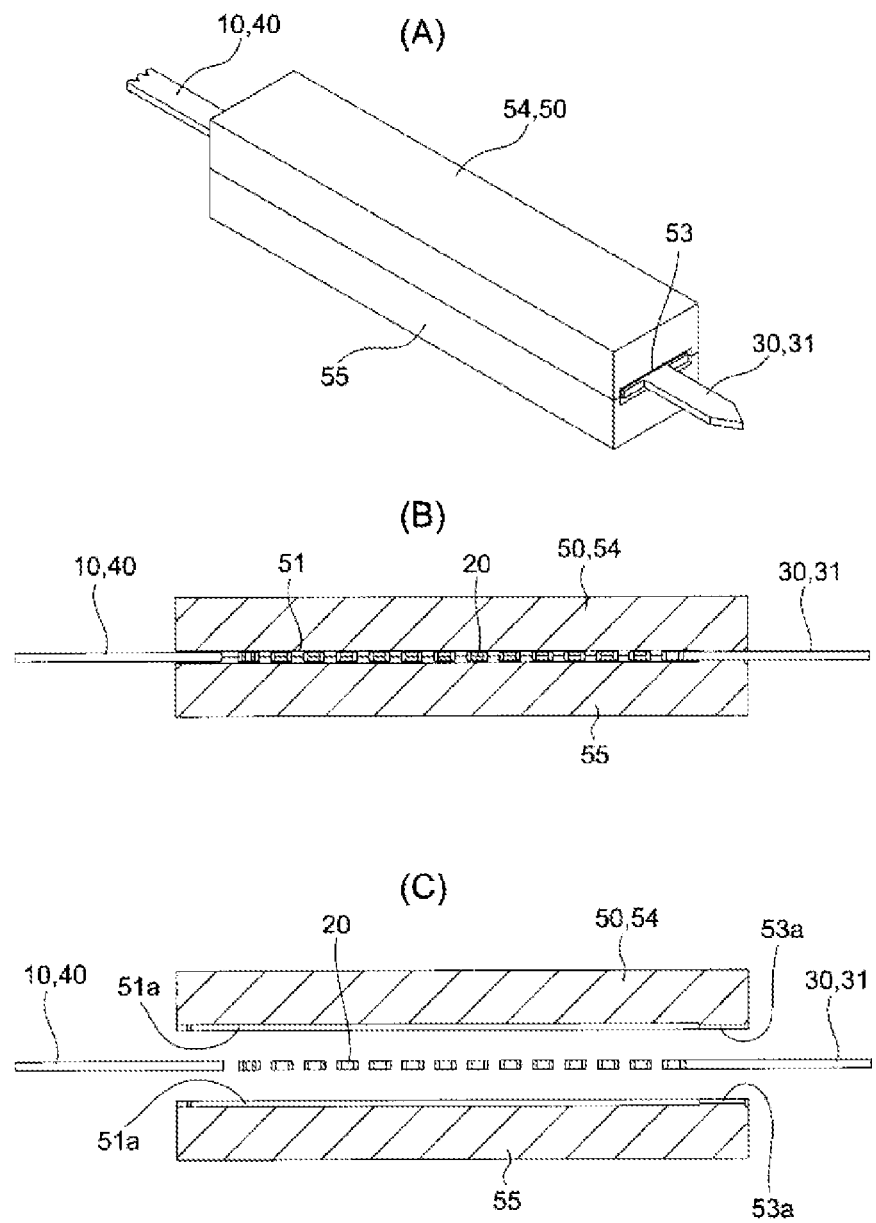
FIG. 6A is a perspective view showing the contactor shown in FIG. 5 after completion of the assembly.
FIGS. 6B and 6C are a sectional view and an exploded sectional view showing the same, respectively.

As shown in FIGS. 5 and 6, a second embodiment is similar to the above first embodiment, and is different therefrom in that the housing 50 is made dividable into divided pieces 54, 55. The divided pieces 54, 55 are provided with depressions 51a, 51a to become the slit 51 on the bonded surfaces thereof, while being provided with notched portions 52a, 52a to become the operation hole 52 and notched portions 53a, 53a to become the press-fitting hole 53. Since the others are the same as those in the first embodiment, the same portion is provided with the same numeral and a description thereof is omitted.

According to the present embodiment, there is an advantage of facilitating an assembly operation since the contactor 10 may only be held between the divided pieces 54, 55.

Figure 7:
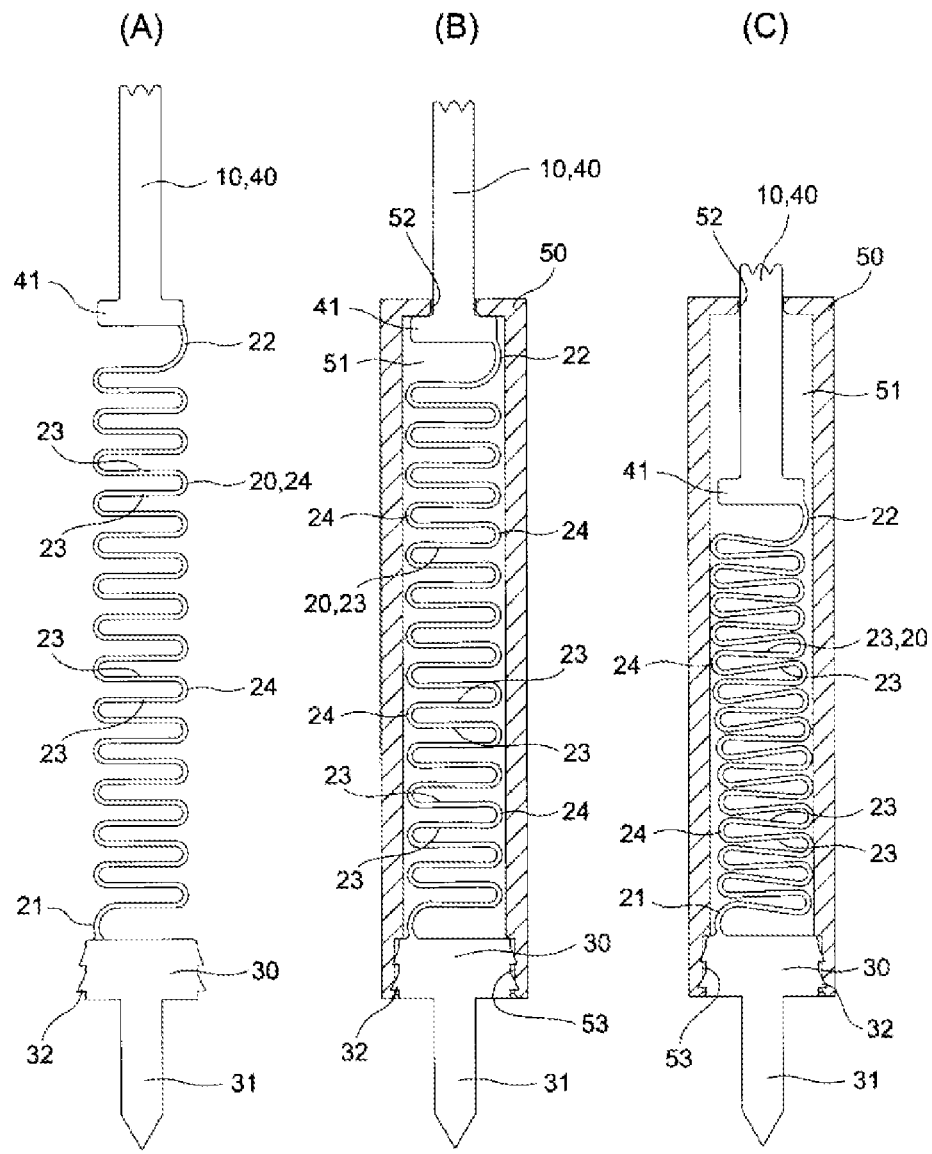
FIG. 7A is a front view of a contactor showing a third embodiment according to the present invention.
FIGS. 7B and 7C are front sectional views respectively showing the contactor before and after the operation.

A third embodiment, as shown in FIG. 7, includes a contactor 10 formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23, and arc portions 24 each connecting adjacent intermediate portions 23.

The one end 21 of the bellows body 20 is connected at an eccentric position relative to the shaft center of the fixed portion 30 at the upper end thereof, and a terminal portion 31 is extended along the shaft center at the lower end of the fixed portion 30. Further, a locking claw portion 32 is projectingly provided on each side surface of the fixed portion 30.

The movable portion 40 has a substantially T-shaped front surface, and the other end 22 of the bellows body 20 is connected at an eccentric position relative to a shaft center at the lower end of the large width portion 41 of the movable portion 40.

The housing 50 has a rectangular-parallelepiped shape having a slit 51 capable of housing the contactor 10, and the upper end of the housing 50 has an operation hole 52, while the lower end thereof has a press-fitting hole 53.

When the movable portion 40 is pressed down, the bellows body 20 is compressed and buckles, and one side of the large width portion 41 comes into contact with the inner side surface of the fixed touch piece 34. Further, the adjacent arc portions 24 come into contact with each other to cause a short circuit, and hence the contact resistance decreases and a current flows.

Figure 8:
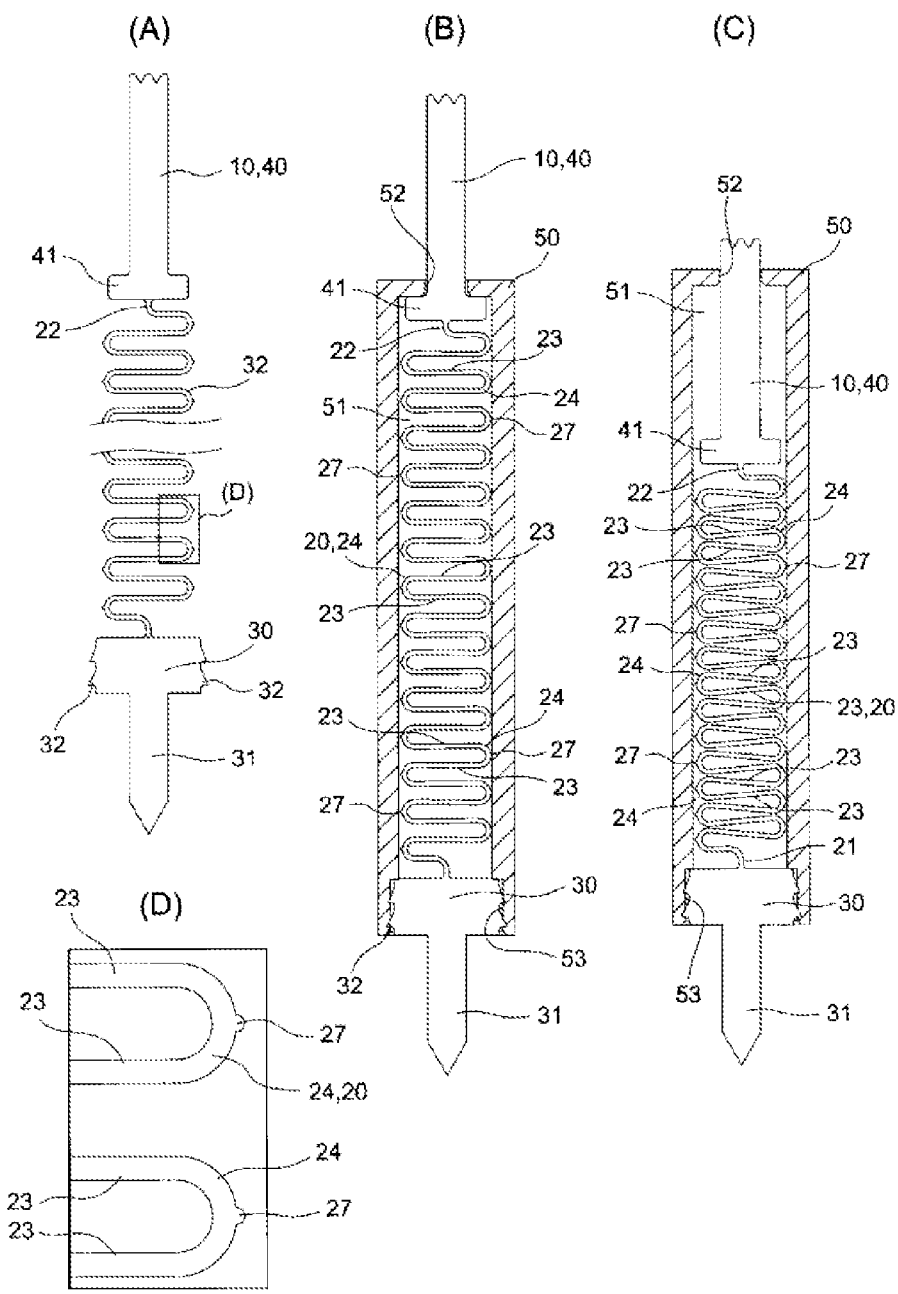
FIG. 8A is a front view of a contactor showing a fourth embodiment according to the present invention.
FIGS. 8B and 8C are front sectional views respectively showing the contactor before and after the operation.
FIG. 8D is a partially enlarged view of FIG. 8A.

As shown in FIG. 8, a fourth embodiment is almost the same as the above first embodiment, and is different therefrom in that a sliding projection 27 is projectingly provided at an apex of the arc portion 24 in the bellows body 20. Since the others are the same as those in the first embodiment, the same portion is provided with the same numeral and a description thereof is omitted.

According to the present embodiment, there is an advantage that friction resistance generated at the time when the sliding projection 27 slides on the inner side surface of the housing 50 decreases to facilitate the assembly operation and obtain the feeling of smooth operation.

Figure 9:
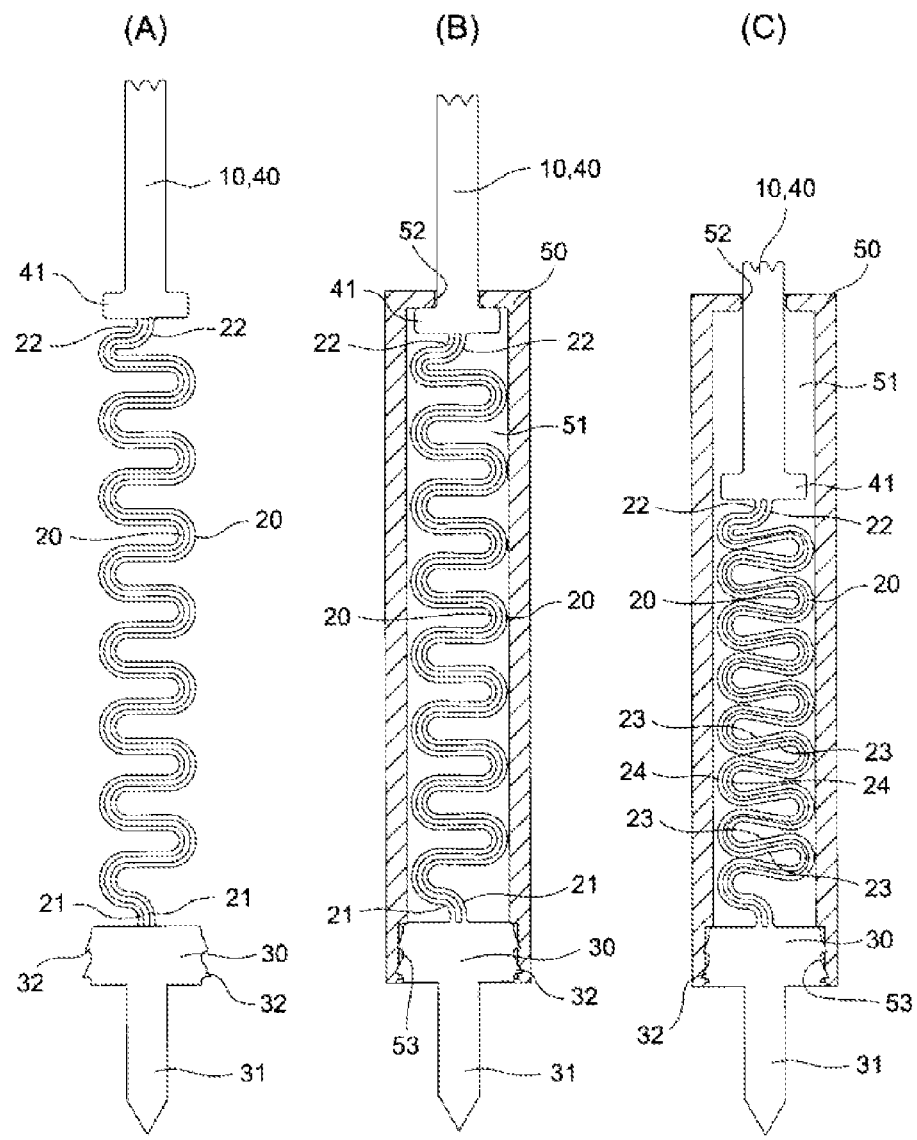
FIG. 9A is a front view of a contactor showing a fifth embodiment according to the present invention.
FIGS. 9B and 9C are front sectional views respectively showing the contactor before and after the operation.

As shown in FIG. 9, a fifth embodiment is almost the same as the above first embodiment, and is different therefrom in that the bellows body 20 is doubly arranged. Since the others are the same as those in the first embodiment, the same portion is provided with the same numeral and a description thereof is omitted.

According to the present embodiment, there is an advantage in that the spring force generated by the bellows body 20 doubles and hence a contactor with large contact pressure can be obtained.

Figure 10:
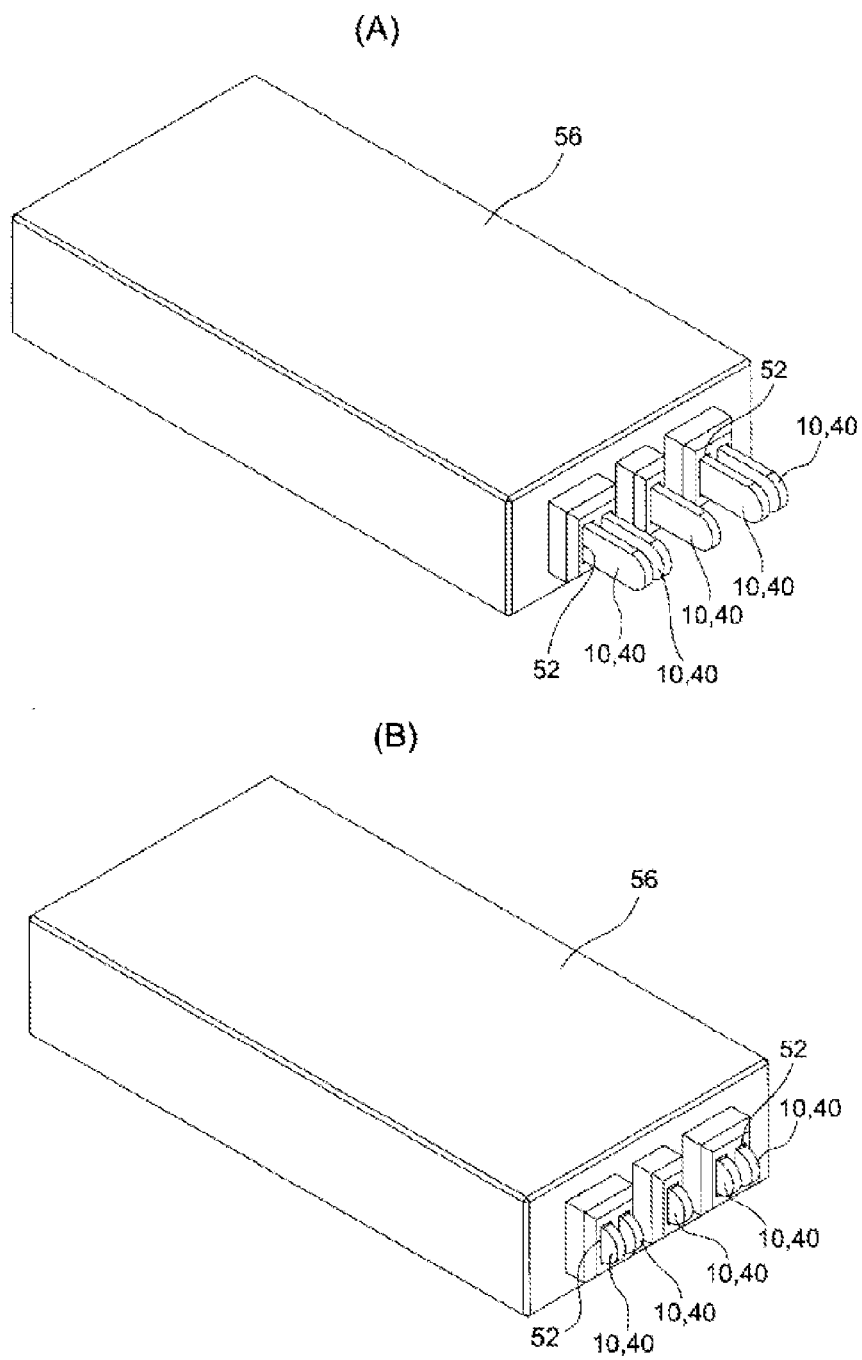
FIGS. 10A and 10B are perspective views of a contactor respectively showing a sixth embodiment according to the present invention before and after the operation.
Figure 11:
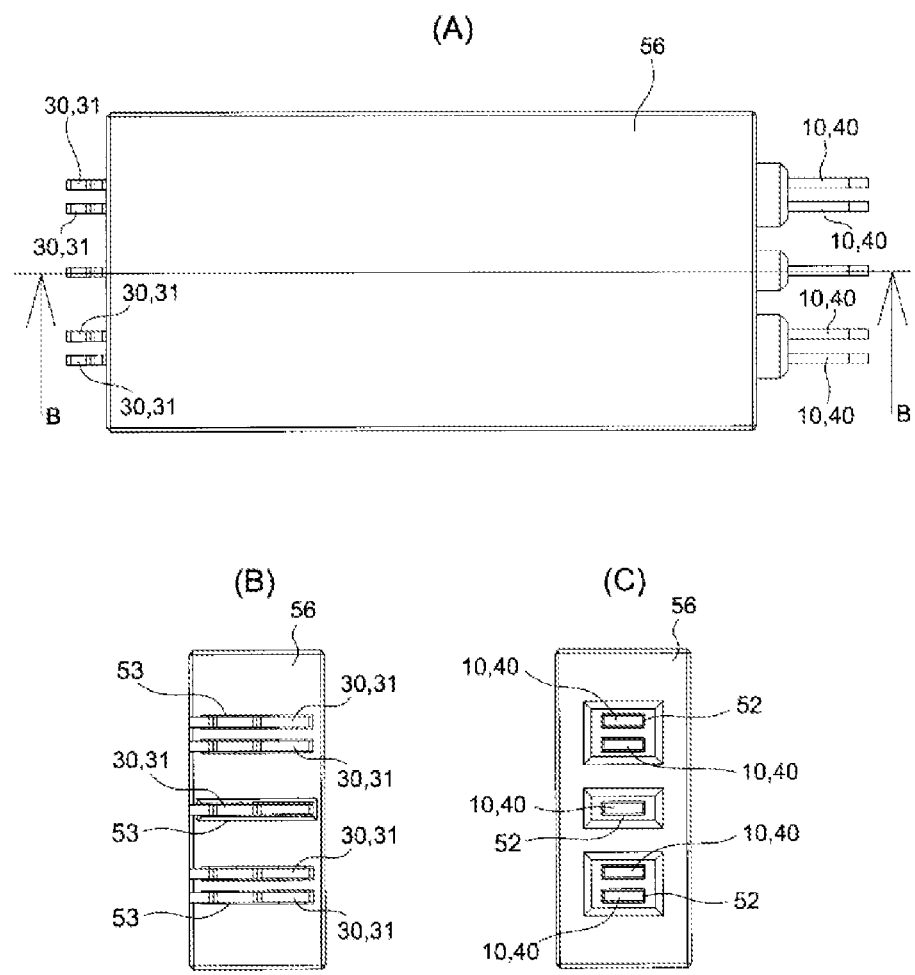
FIGS. 11A, 11B and 11C are a plan view, a left side view and a right side view of the contactor showing the sixth embodiment shown in FIG. 10, respectively.
Figure 12:
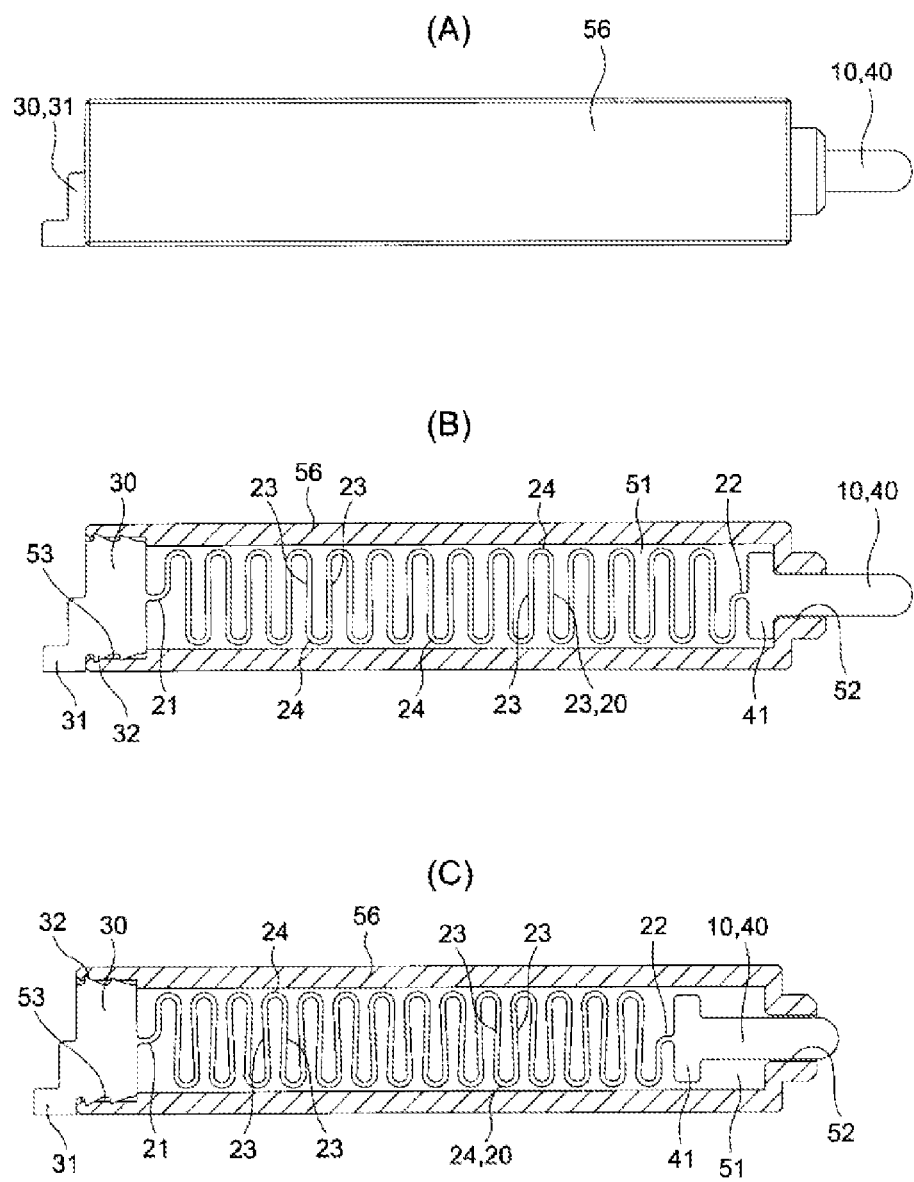
FIG. 12A is a front view showing the sixth embodiment shown in FIG. 10, and FIGS. 12B and 12C are front sectional views respectively showing the contactor before and after the operation.

As shown in FIGS. 10 to 12, a sixth embodiment concerns a connection connector of a battery.

That is, a plurality of contactors 10 each formed of a bellows body 20, a fixed portion 30 connected to one end 21 of the bellows body 20, and a movable portion 40 connected to the other end 22 of the bellows body 20, are housed inside a housing 56.

As shown in FIG. 12, the bellows body 20 is formed of linear-shaped intermediate portions 23, and arc portions 24 each connecting adjacent intermediate portions 23.

The one end 21 of the bellows body 20 is connected to the shaft center of the fixed portion 30 at the right end thereof, and a terminal portion 31 is projectingly provided at the left-end corner portion of the fixed portion 30. Further, the locking claw portions 32 are projectingly provided respectively on the upper and lower end surfaces of the fixed portion 30.

The movable portion 40 has a substantially T-shaped front surface, and the other end 22 of the bellows body 20 is connected at the shaft center of the left end of the movable portion 40.

As shown in FIG. 12, the housing 50 has a rectangular-parallelepiped shape having a slit 51 capable of housing the contactor 10, and the right end surface of the housing 50 has an operation hole 52, while the left end surface thereof has a press-fitting hole 53.

According to the present embodiment, as shown in FIG. 12, when the movable portion 40 is pressed inward, the bellows body 20 is compressed and the adjacent arc portions 24 come into contact with each other to cause a short circuit, whereby the contact resistance decreases and a current flows.

Figure 13:
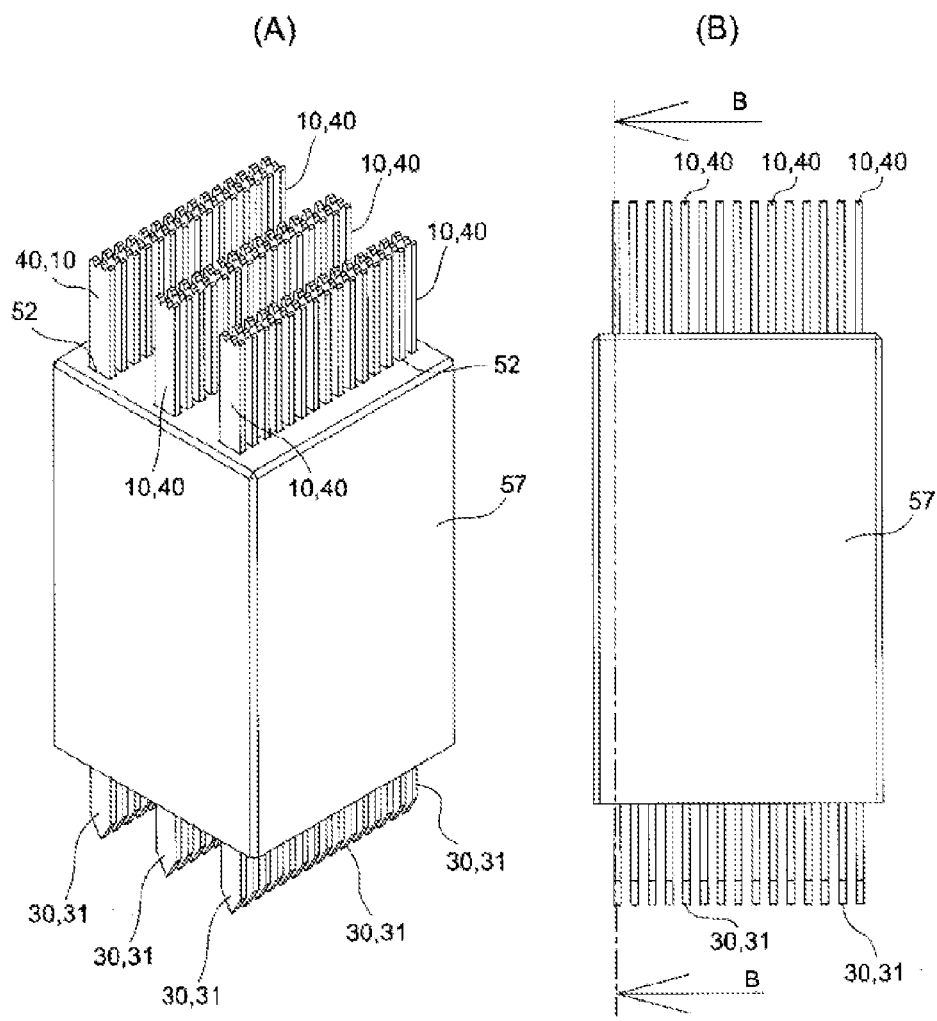
FIGS. 13A and 13B are a perspective view and a right side view showing a seventh embodiment according to the present invention, respectively.
Figure 14:
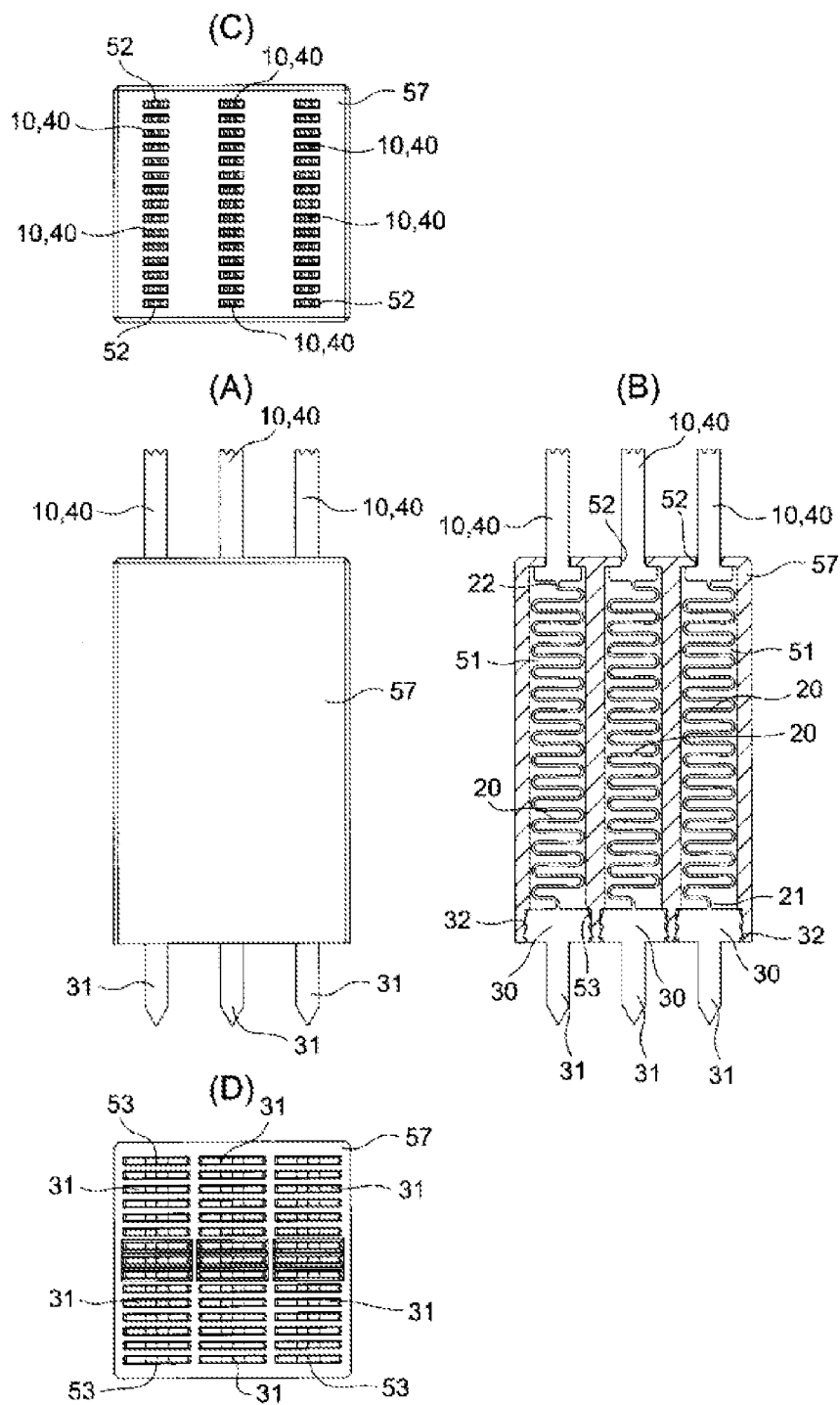
FIGS. 14A, 14B, 14C and 14D are a front view, a front sectional view, a plan view and a bottom view of the seventh embodiment shown in FIG. 13, respectively.

As shown in FIGS. 13 and 14, a seventh embodiment concerns a semiconductor circuit inspection probe.

That is, a plurality of contactors 10 each formed of a bellows body 20, a fixed portion 30 connected to one end 21 of the bellows body 20, and a movable portion 40 connected to the other end 22 of the bellows body 20, are housed inside a housing 57.

As shown in FIG. 13, the bellows body 20 is similar to the above first embodiment, and formed of the linear-shaped intermediate portions 23, and the arc portions 24 each connecting adjacent intermediate portions 23.

The one end 21 of the bellows body 20 is connected to the shaft center of the fixed portion 30 at the upper end thereof, and a terminal portion 31 is extended from the lower end of the fixed portion 30. Further, a locking claw portion 32 is projectingly provided on each side surface of the fixed portion 30.

The movable portion 40 has a substantially T-shaped front surface, and the other end 22 of the bellows body 20 is connected onto the shaft center of the lower end of the movable portion 40.

As shown in FIG. 14, the housing 57 has a rectangular-parallelepiped shape where three rows of slits 51 capable of housing a plurality of the contactors 10 juxtaposed in a large number, and the upper end surface of the housing 57 has operation holes 52, while the lower end surface thereof has press-fitting holes 53.

According to the present embodiment, the contactor 10 can be molded thin, so as to integrate a large number of contactors 10 and obtain a small-sized semiconductor circuit inspection probe.

Further, with the long bellows body 20 provided, there is an advantage of being able to obtain a semiconductor circuit inspection probe having a desired displacement amount.

As apparent from the above examples, the contactor according to the present invention is not only usable as an integrated circuit inspection probe, but also usable as a contact terminal of a battery or a switch. Especially when it is used as the integrated circuit inspection probe, since the above contactor can be formed thin, it is possible to arrange a large number of contactors at narrow pitches.

As described above, a contactor according to the present invention has a configuration where a bellows body, a fixed portion connected to one end of the bellows body and a movable portion connected to the other end of the bellows body are integrally molded by electroforming, and the movable portion is depressed to compress the bellows body, so that adjacent arc portions of the bellows body are brought into contact with each other to cause a short circuit. Accordingly, since the contactor has been integrally molded by electrical casting, even when the contactor has a long and narrow shape, processing strain does not occur, and hence it is possible to obtain a contactor having a long life.

Further, even if the bellows body is made long for the purpose of ensuring a desired displacement amount, the adjacent arc portions of the bellows body come into contact with each other to cause a short circuit, and hence it is possible to reduce contact resistance and thus obtain a contactor with small contact resistance.

Further, this eliminates the need for an expensive mold for press working, to allow reduction in production cost.

As described above, the bellows body may have a shape made up of linear-shaped intermediate portions and arc portions each configured to connect the adjacent intermediate portions. Accordingly, it is possible to obtain a contactor easy to design.

Alternatively, the bellows body may have a shape made up of curve-shaped intermediate portions and arc portions each configured to connect the adjacent intermediate portions. Accordingly, there is an advantage of increasing the design flexibility.

As a different embodiment, two bellows bodies may be juxtaposed in parallel. Accordingly, spring force doubles, and hence it is possible to obtain a contactor with large contact pressure.

As discussed, in a different embodiment, a sliding projection may be provided at an apex of the arc portion in the bellows body. Accordingly, it is possible to reduce friction resistance by the sliding projection, so as to facilitate an assembly operation at the time of insertion into a housing or the like, while improving operation feeling.

As a different embodiment of the present invention, the bellows body is connected to the fixed portion at a shaft center of the fixed portion or is connected at an eccentric position relative to the shaft center of the fixed portion. Accordingly, when the connection is arranged at the shaft center of the fixed portion, it is possible to obtain a contactor being operable by small force of operation and having a long life. When the connection is arranged at an eccentric position, the bellows body is apt to buckle, and hence it is possible to obtain a contactor with high contact pressure.

Alternatively, the bellows body may be connected to the movable portion at a shaft center of the movable portion, or at an eccentric position relative to the shaft center of the movable portion. When the connection is at the shaft center of the movable portion, it is possible to obtain a contactor being operable by small force of operation and having a long life. When the connection is at an eccentric position relative to the shaft center, the bellows body is apt to buckle, and hence it is possible to obtain a contactor with high contact pressure.

As discussed above, a locking claw portion may be provided on at least one side surface of the fixed portion. Accordingly, when the contactor is assembled in the housing, the locking claw portion is locked inside the housing and can thus be prevented from being slipped out.

A probe according to the present invention has a configuration where the at least one contactor described above is housed inside a housing. Accordingly, since the contactor has been integrally molded by electrical casting, even when the contactor has a long and narrow shape, processing strain does not occur, and hence it is possible to obtain a probe having a contactor with a long life.

Further, even if the bellows body is made long for the purpose of ensuring a desired displacement amount, the adjacent arc portions of the bellows body come into contact with each other to cause a short circuit, thus allowing reduction in contact resistance, and there is thus an effect of being able to obtain a probe having a contactor with small contact resistance.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:

1. A contactor comprising:
   a bellows body housed inside a housing;
   a fixed portion having a locking craw portion being locked onto an inner surface of a press-fitting hole of the housing to prevent slipping-out, the fixed portion connected to one end of the bellows body and fixed to the housing, and
   a movable portion connected to the other end of the bellows body, the movable portion being movable being movable within the housing,
   wherein the bellows body, the fixed portion and the movable portion are integrally molded by electroforming,
   the movable portion is configured to be depressed to compress the bellows body, so that the adjacent arc portions of the bellows body are brought into contact with each other to cause a short circuit,
   a position of the fixed portion to which the bellows body is connected is an eccentric position relative to a shaft center of the fixed portion,
   the fixed portion has a terminal portion at an opposite side of the bellows body, and the terminal portion extends along the shaft center.

2. The contactor according to claim 1, wherein an aspect ratio of a cross section of the bellows body is not smaller than 1.5.

3. The contactor according to claim 1, wherein the bellows body is made up of linear-shaped intermediate portions wherein the arc portions connect adjacent intermediate portions.

4. The contactor according to claim 1, wherein the bellows body is made up of curve-shaped intermediate portions and wherein the arc portions connect adjacent intermediate portions.

5. The contactor according to claim 1, wherein two bellows bodies are juxtaposed in parallel.

6. The contactor according to claim 1, wherein the bellows body is connected to the movable portion at a shaft center of the movable portion.

7. The contactor according to claim 1, wherein the bellows body is connected to the movable portion at an eccentric position relative to a shaft center of the movable portion.

8. A probe, wherein the at least one contactor according to claim 1 is housed inside a housing.

9. A contactor comprising:
   a bellows body housed inside a housing;
   a fixed portion having a locking craw portion being locked onto an inner surface of a press-fitting hole of the housing to prevent slipping-out, the fixed portion connected to one end of the bellows body and fixed to the housing, and
   a movable portion connected to the other end of the bellows body, the movable portion being movable within the housing,
   wherein the bellows body, the fixed portion and the movable portion are integrally molded by electroforming,
   the movable portion is configured to be depressed to compress the bellows body, so that adjacent arc portions of the bellows body are brought into contact with each other to cause a short circuit,
   a position of the movable portion to which the bellows body is connected is an eccentric position relative to a shaft center of the movable portion,
   the movable portion has a large width portion and a projection at an opposite side to the bellows body, and
   the projection extends along the shaft center from the large width portion.

10. The contactor according to claim 9, wherein an aspect ratio of a cross section of the bellows body is not smaller than 1.5.

11. The contactor according to claim 9, wherein the bellows body is made up of linear-shaped intermediate portions wherein the arc portions connect adjacent intermediate portions.

12. The contactor according to claim 9, wherein the bellows body is made up of curve-shaped intermediate portions and wherein the arc portions connect adjacent intermediate portions.

13. The contactor according to claim 9, wherein two bellows bodies are juxtaposed in parallel.

14. The contactor according to claim 9, wherein the bellows body is connected to the fixed portion at a shaft center of the fixed portion.

15. The contactor according to claim 9, wherein the bellows body is connected to the fixed portion at an eccentric position relative to a shaft center of the fixed portion.

16. A probe, wherein the at least one contactor according to claim 9 is housed inside a housing.

* * * * *